(12) United States Patent
Lee et al.

(10) Patent No.: US 6,723,662 B2
(45) Date of Patent: Apr. 20, 2004

(54) METHODS OF FORMING GATE OXIDE FILMS IN INTEGRATED CIRCUIT DEVICES USING WET OR DRY OXIDIZATION PROCESSES WITH REDUCED CHLORIDE

(75) Inventors: Kong-soo Lee, Gyeonggi-do (KR); Jae-jong Han, Seoul (KR); Sung-eui Kim, Gyeonggi-do (KR)

(73) Assignee: Samsung Electronics Co., Ltd. (KR)

(*) Notice: Subject to any disclaimer, the term of this patent is extended or adjusted under 35 U.S.C. 154(b) by 0 days.

(21) Appl. No.: 10/630,101

(22) Filed: Jul. 30, 2003

(65) Prior Publication Data
US 2004/0029398 A1 Feb. 12, 2004

(30) Foreign Application Priority Data
Aug. 7, 2002 (KR) ...................... 2002-0046611

(51) Int. Cl.[7] ..................... H01L 21/8242; H01L 21/31; H01L 21/469

(52) U.S. Cl. ................ 438/774; 438/241; 438/286; 438/296

(58) Field of Search ................ 438/774, 241, 438/286, 296

(56) References Cited

U.S. PATENT DOCUMENTS

| | | | | |
|---|---|---|---|---|
| 5,882,993 A | * | 3/1999 | Gardner et al. | 438/591 |
| 6,093,659 A | * | 7/2000 | Grider et al. | 438/758 |
| 6,204,205 B1 | * | 3/2001 | Yu et al. | 438/787 |
| 6,387,764 B1 | * | 5/2002 | Curtis et al. | 438/476 |
| 6,387,827 B1 | * | 5/2002 | Curtis et al. | 438/296 |
| 6,410,991 B1 | * | 6/2002 | Kawai et al. | 257/392 |
| 6,423,617 B1 | * | 7/2002 | Powell | 438/476 |
| 6,430,625 B1 | * | 8/2002 | Kley et al. | 709/246 |
| 6,593,196 B2 | * | 7/2003 | Akram et al. | 438/303 |

FOREIGN PATENT DOCUMENTS

| | | |
|---|---|---|
| JP | 7169762 | 7/1995 |
| JP | 11145132 | 5/1999 |
| KR | 2002009213 | 2/2002 |

* cited by examiner

*Primary Examiner*—Alexander Ghyka
(74) *Attorney, Agent, or Firm*—Myers Bigel Sibley & Sajovec, P.A.

(57) ABSTRACT

Methods of forming gate oxide films in integrated circuit devices using wet or dry oxidization processes with a reduced amount of chloride are disclosed. A gate oxide film is formed on a substrate on an active region adjacent to a trench isolation region in a first gas atmosphere with a first amount of chloride. The gate oxide film is annealed in a second gas atmosphere including a second amount of chloride that is greater than the first amount.

29 Claims, 6 Drawing Sheets

METHODS OF FORMING GATE OXIDE FILMS IN INTEGRATED CIRCUIT DEVICES USING WET OR DRY OXIDIZATION PROCESSES WITH REDUCED CHLORIDE

RELATED APPLICATION

This application claims the benefit of Korean Patent Application No. 2002-0046611, filed Aug. 7, 2002, the disclosure of which is hereby incorporated herein by reference in its entirety as if set forth fully herein.

FIELD OF THE INVENTION

The present invention relates to methods for forming integrated circuit devices, and more particularly to methods for forming gate oxide films of a integrated circuit device.

BACKGROUND

In some highly integrated semiconductor devices, shallow trench isolation (STI) structures have been utilized for the isolation of active areas therein. In some conventional processes used to form STI structures, a pad oxide film and a nitride film are successively formed on a silicon substrate and then nitride film is patterned. A trench can be formed by etching the substrate to a predetermined depth using the patterned nitride film as an etching mask. An oxide film is formed to cover the trench and is left only in the trench, using an etch-back process or a chemical-mechanical polishing (CMP) process, thereby forming the STI structure.

A thin oxide film can be formed in the trench using a thermal oxidation process. An oxide film can then be formed to fill the trench in order to compensate for damage to the silicon substrate that may be caused during the etching process. However, the volume of the oxide film in the trench may increase due to the heat generated during successive thermal processes, such as the process for forming the gate oxide film, thereby potentially causing silicon dislocations in the substrate.

If the nitride film that serves as the etching mask is removed using a wet etching process, a dent may occur at the surface boundary between the active region and the STI region. Hence, the thickness of the gate oxide film may be reduced at the edge portion of the active region adjacent to the upper corner of the STI region so that an inverse narrow width effect may occur. The inverse narrow width effect may reduce the reliability of the gate oxide film because the electric field may be concentrated at the edge portion of the active region as the thickness of the gate oxide film is reduced. The inverse narrow width effect may reduce the threshold voltage of a transistor, particularly when the channel width of the transistor is also reduced.

It is known to form a thin nitride liner on the inner sidewall of the trench in order to reduce the thinning of the gate oxide film at the edge portion of the active region and to reduce additional oxidation of the trench due to penetration of oxygen ($O_2$) into the inner sidewall of the trench during a successive oxidation process.

Generally, a volume of a layer including silicon increases when the silicon is oxidized. The volume of the oxide film in the trench may, therefore, be increased while the inner sidewall of the trench is oxidized as the oxide film fills the trench. Hence, a stress can be generated in the semiconductor substrate such that silicon dislocation may occur in the substrate which may give rise to a leakage current. The leakage current can be generated by silicon dislocation that may provide a path for an electron flow in the substrate. The nitride liner may reduce a stress caused by the increase in the volume of the insulation film in the trench, and may prevent oxygen from penetrating into the trench during the successive oxidization process discussed above, which may reduce or prevent silicon dislocation and, thereby reduce the leakage current.

It is also known to form multiple gate oxide films having various thickness in various regions of a substrate. For example, some conventional SRAM devices include a dual gate oxide film in which one gate oxide film is thin in the cell region of the SRAM device while the other gate oxide film is thick on the input/output terminal. DRAM devices can also include dual gate oxide films having a thick gate oxide film in the cell region and a thin gate oxide film in the peripheral region. In this case, the refresh operations and the quality of the gate oxide film can be improved because the threshold voltage of a cell transistor therein can be compensated by the increase in the thickness of the gate oxide film in the cell region such that the dosage of ions implanted into the channel can be reduced.

Multiple gate oxide films are generally formed through a wet etching process or a process in which the oxidization rate of an oxide film can be varied by implanting ions, such as fluorine (F) or nitrogen (N) ions. In some conventional methods of forming dual gate oxide films using wet etching, after a first gate oxide film is formed on a semiconductor substrate, a portion of the first gate oxide film is removed from a first region of the semiconductor substrate through a photolithography process and a wet etching process. Then, a second gate oxide film is formed on the whole surface of the substrate so that the dual gate oxide film has a thickness in a second region of the substrate that is greater than the thickness of the dual gate oxide film in the first region of the substrate.

In general, the gate oxide film can be formed: 1) through a dry oxidization process using an $O_2$ gas; 2) through a hydrochloric acid oxidization process using $O_2/HCl$ gas; or 3) through a wet oxidization process using a gas of $H_2/O_2$ or $H_2O$. An oxide film formed by either the dry oxidation process or the hydrochloric acid oxidization process may have defects known as "micro pores" or voids formed therein. However, the hydrochloric acid oxidization process may also provide neutralization (or Gettering) of the alkali metal ions in a silicon oxide film, improved channel mobility, and an improved Time Zero Dielectric Breakdown (TZDB) characteristic indicating the short term reliability of the semiconductor device. In contrast, an oxide film formed using the wet oxidization process may have fewer micro pore defects or voids (compared to both the dry process and the hydrochloric acid oxidization) and may have good Time-Dependent Dielectric Breakdown (TDDB) characteristic representing the long-term reliability of the semiconductor device. Hence, the oxide film may be preferably formed using either the wet process or the hydrochloric acid oxidization process considering the desired reliability of the semiconductor device. On the other hand, because the wet oxidization process can grow an oxide film rapidly, it may be desirable to grow the oxide film using the hydrochloric acid oxidization process in some circumstances, such as where a highly integrated semiconductor device calls for a thin gate oxide film having a thickness of less than approximately 60 Å.

When the gate oxide film is formed in a semiconductor device (having an STI structure including a liner formed in the trench) using the hydrochloric acid oxidization process, the thickness of the gate oxide film can be abnormally thickened at the edge portion of the active region, which is the upper corner of the STI region. As a result, the effective width of the channel that provides a passage for current flow in the device may be shortened and the saturation current may also be reduced which can reduce the speed of the transistor when the transistor is turned "on" (i.e., when a threshold voltage is applied to the gate electrode of the transistor).

FIG. 1 is a graph showing variations of saturation current of a cell transistor according to conventional methods of forming a gate oxide film. For example, in cases where a dual gate oxide film is employed in the semiconductor device having the minimum size of approximately 0.126 μm, the first gate oxide film formed using a hydrochloric acid oxidization process (denoted by "○") has a $I_{dsat}$ that is approximately 30 percent less than that of the first gate oxide film formed by the wet oxidization process (denoted by "●") when the threshold voltage is about 1.4 Volts (V) as shown in FIG. 1.

FIG. 2 is a schematic cross-sectional view illustrating thickening of a gate oxide film at edge portion of an active region according to a hydrochloric acid oxidization process. FIG. 3 is a graph shown in; the thickness of an oxide film as a function of time formed at a temperature of approximately 850° C. according to conventional methods.

Two of the reasons that the thickness of the ate oxide film can thicken at the edge portion of the active region when the gate oxide film is formed by the hydrochloric acid oxidization process are discussed below. Specifically, the two reasons address the formation of the gate oxide film using the hydrochloric acid oxidization process in a semiconductor device that includes the STI structure having a liner on the inner sidewall of the trench.

With reference to FIG. 2, a tensile stress (T.S) associated with a nitride liner (NL) can cause the nitride film to become thicker in the vertical direction. Such tensile stress of the nitride liner can be transferred to the inner oxide film (TIO) formed on the inner sidewall of the trench. The tensile stress (T.S) of the inner oxide film (TIO) can cause a compressive stress (C.S) effect between the inner sidewall of the trench and the inner oxide film (TIO) in the horizontal direction as shown in FIG. 2.

As shown in FIG. 3, the growth rate of the oxide film formed using the hydrochloric acid oxidization process (denoted by "□") is greater than that of the oxide film formed with the dry oxidization process (denoted by "○"). In the hydrochloric acid oxidization process (□), the growth rate of the oxide film can be reduced for thickness of approximately 40 Å whereas the growth rate of the oxide film formed using the wet oxidization process (denoted by "Δ") can increase linearly. As a result, the hydrochloric acid oxidization process (□) is a diffusion limited process compared to the dry oxidization process (○) and the wet oxidization process (Δ).

In the diffusion limited process, the growth rate of the oxide film can be varied in accordance with the stress in the oxide film. That is, as shown in FIG. 2, when the compressive stress (C.S) is applied to the inner oxide film (TIO) in the trench in the horizontal direction, the diffusion of $O_2$ is limited and the diffusion of HCl is restrained so that the concentration of HCl can be locally increased toward the upper corner of the STI region and the edge portion of the active region. When the concentration of HCl increases, the thickness of the oxide film can also increase due to the growth of the oxide film as shown in FIG. 3.

Japanese Laid-Open Patent Publication No. 11-145132 discusses a method of forming a gate oxide film by successively treating in a chloride gas atmosphere after a semiconductor substrate is previously treated under the chloride gas atmosphere and the gate oxide film is formed in an oxygen gas atmosphere. Japanese Laid-Open Patent Publication No. 7-169762 discloses another method in which a gate oxide film is treated in an inert gas atmosphere after a semiconductor substrate is treated in a hydrogen gas atmosphere and the gate oxide film is formed by a wet oxidization process. Korean Patent Laid-Open Publication No. 2002-9213 discusses another method for annealing a semiconductor substrate including a first and second gate oxide films formed thereon using a gas of HCl during a process of forming a dual gate oxide film.

FIG. 6A is an enlarged cross-sectional view illustrating a profile of an STI region formed according to the conventional methods of forming a dual gate oxide film discussed above. As shown in FIG. 6A, a first gate oxide film 20 having a thickness of approximately 73 Å is formed on a semiconductor substrate where an active region 12 is defined by STI regions 18 including an inner oxide film 14 and a nitride liner 16 formed on an inner sidewall of a trench. The first gate oxide film 20 is formed through a hydrochloric acid oxidization process using a gas of $O_2$/HCl.

The semiconductor substrate is rinsed by a wet rinsing process after the first gate oxide film 20 is removed from a peripheral circuit region (not shown) where a thin gate oxide film is to be formed through a photolithography process and a wet etching process. Subsequently, a second gate oxide film (not shown) having a thickness of approximately 54 Å is formed in the peripheral circuit region through a hydrochloric acid oxidization process using a gas of $O_2$/HCl. As a result, the first gate oxide film 20 in the cell region can be thickened from about 73 Å to about 83 Å.

When the first gate oxide film 20 is formed using the hydrochloric acid oxidization process, the concentration of HCl can be locally increased toward the edge portion of the active region 12 due to the compressive stress applied to the inner oxide film 14 in the horizontal direction due to the nitride liner 16 as discussed above in reference to FIG. 2. If the concentration of HCl is increased at the edge portion, the thickness of the first gate oxide film 20 can be increased at the edge portion A of the active region 12 because the growth of the oxide film may increase. As a result, the effective width of an channel may be reduced. Reducing the effective width of the channel may reduce the saturation current ($I_{dast}$) of the transistor may be reduced which may decrease the speed of the transistor.

SUMMARY

Embodiments according to the invention can provide methods of forming gate oxide films using wet or dry oxidization without chloride. Pursuant to these embodiments, a gate oxide film of an integrated circuit device can be formed by forming a gale oxide film on a substrate on an active region adjacent to a trench isolation region in a first gas atmosphere with a first amount of chloride. The gate oxide film is annealed in a second gas atmosphere including a second amount of chloride that is greater than the first amount.

In some embodiments according to the invention, the gate oxide film is a first gate oxide film and the active region is a first active region in a cell region of the integrated circuit device. A second gate oxide film can be formed on a second active area of the substrate in a peripheral region of the integrated circuit device spaced apart from the first active area in a second gas atmosphere with the second amount of chloride.

In some embodiments according to the invention, the first amount of chloride comprises substantially no chloride. In some embodiments according to the invention, the first gate oxide film has a first thickness. The first thickness of the first gate oxide film can be reduced and an oxidization process can be performed on the substrate spaced apart from the first gate oxide film using a third gas including chloride to form a second gate oxide film to a second thickness and to thicken the first gate oxide film to a third thickness that is greater than the second thickness.

In some embodiments according to the invention, the first gas can be at least one of $O_2$ gas. $O_2/N_2$ gas, $O_2/N_2O$ as and $O_2/NO$ gas. In some embodiments according to the invention, the first as can be at least one of $H_2/O_2$ gas or $H_2O$ gas.

In some embodiments according to the invention, the gate oxide film can be formed at a temperature in a range between about 780° C. and about 900° C. In some embodiments according to the invention, the gate oxide film can be formed at a temperature in a range between about 780° C. and about 850° C.

In some embodiments according to the invention, a ratio between a first thickness of portion of the gate oxide film located on a central portion of the active region and a second thickness of a portion of the gate oxide film located at an edge portion of the active region is in a range between about 1:1 and about 1:1.5.

In some embodiments according to the invention, the second gas includes at least one selected from the group consisting of HCl, $Cl_2$, $C_2HCl_3$, $CH_2Cl_2$, and $C_2H_3Cl_3$. In some embodiments according to the invention, the annealing can be provided by annealing the first gate oxide film using a furnace or by performing a rapid thermal annealing process. In some embodiments according to the invention, the gate oxide film is annealed at a temperature in a range between about 850° C. and about 900° C. In some embodiments according to the invention, the formation of the gate oxide film and the annealing are performed in-situ.

Figure 1:
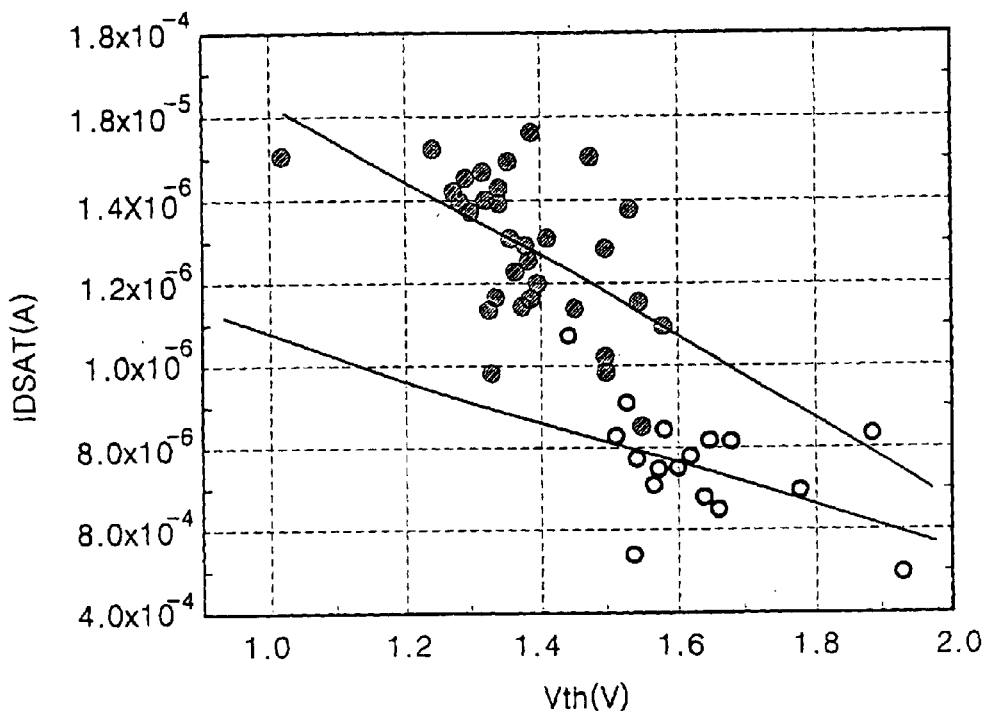
FIG. 1 is a graph showing variations of saturation current of a cell transistor according to conventional methods of forming a gate oxide film.
Figure 2:
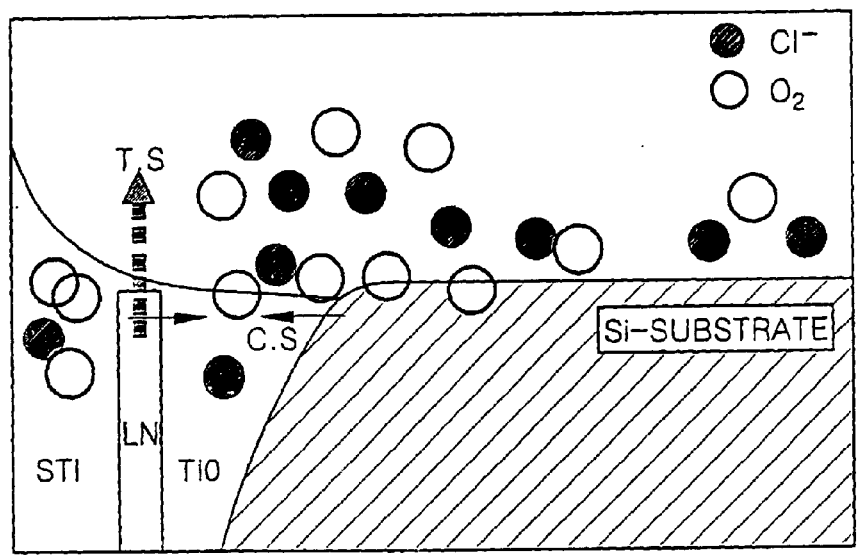
FIG. 2 is a schematic cross-sectional view illustrating increasing thicknesses of gate oxide films at an edge portion of an active region according to a conventional hydrochloric acid oxidization process.
Figure 3:
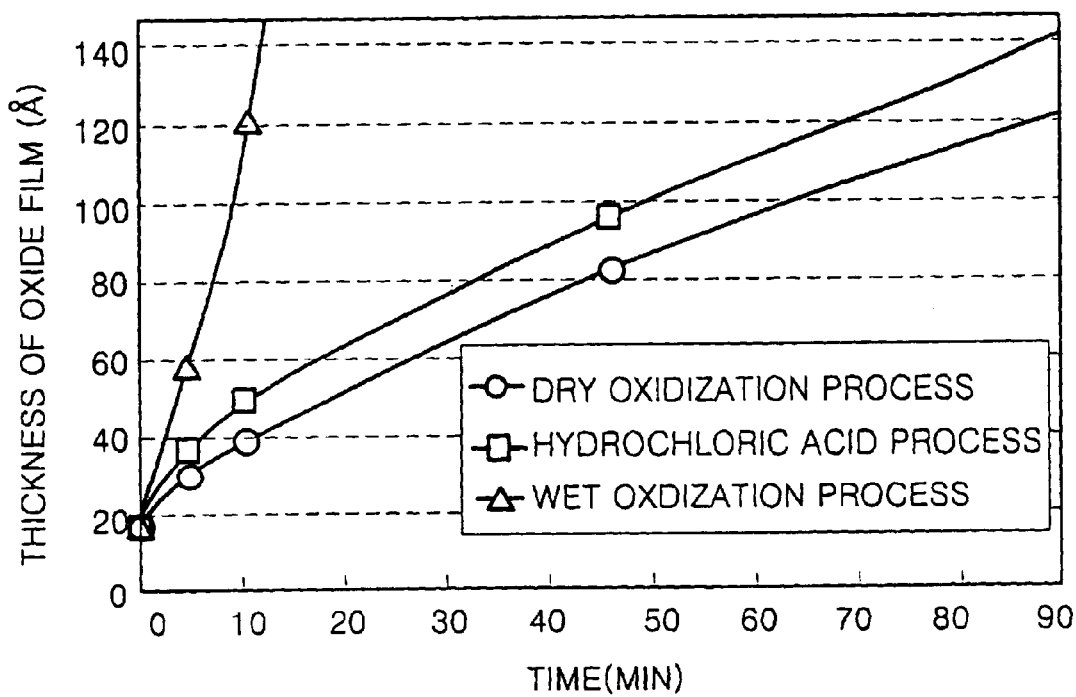
FIG. 3 is a graph showing growth rates of oxide films according to conventional methods of forming the oxide films.

DESCRIPTION OF EMBODIMENTS
ACCORDING TO THE INVENTION

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thickness of layers and regions are exaggerated for clarity. It will be understood that when an element such as a layer, region or substrate is referred to as being "on" another element, it can be directly on the other element or intervening elements may also be present. It will be understood that when an element such as a layer, region or substrate is referred to as "under" another element, it can be directly under the other element or intervening elements may also be present. It will be understood that if part of an element, such as a surface of a conductive line, is referred to as "outer," it is closer to the outside of the integrated circuit than other parts of the element.

Furthermore, relative terms such as beneath may be used herein to describe one layer or regions relationship to another layer or region as illustrated in the Figures. It will be understood that these terms are intended to encompass different orientations of the device in addition to the orientation depicted in the Figures. For example, if the device in the Figures is turned over, layers or regions described as "beneath" other layers or regions would now be oriented "above" these other layers or regions. The term "beneath" is intended to encompass both above and beneath in this situation. Like numbers refer to like elements throughout.

It will be understood that although the terms first and second are used herein to describe various regions, layers and/or sections, these regions, layers and/or sections should not be limited by these terms. These terms are only used to distinguish one region, layer or section from another region, layer or section. Thus, a first region, layer or section discussed below could be termed a second region, layer or section, and similarly, a second region, layer or section may be termed a first region, layer or section without departing from the teachings of the present invention.

Figure 4A:
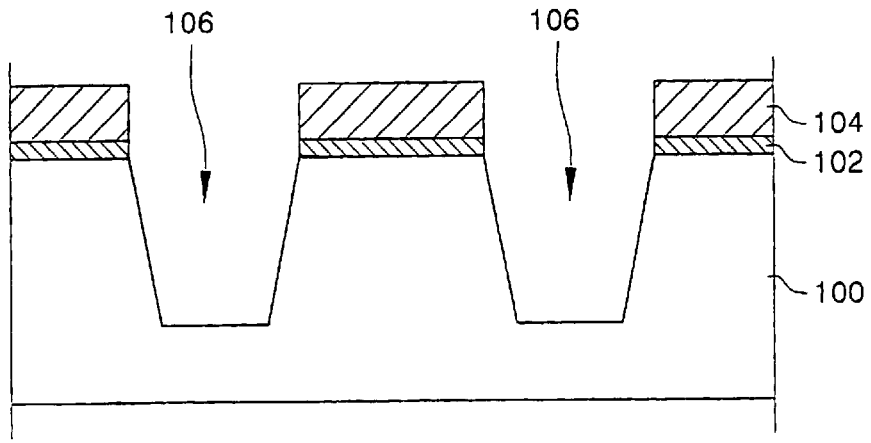
FIGS. 4A to 4E are cross-sectional views illustrating methods of forming a gate oxide film according to embodiments of the present invention.

FIGS. 4A to 4E are cross-sectional views illustrating methods of forming a gate oxide film according to embodiments of the present invention. Referring to FIG. 4A a pad oxide film is formed on a semiconductor substrate 100, such as a silicon wafer, by a thermal oxidation process, which may reduce a stress applied to the semiconductor substrate 100. A nitride film is coated on the pad oxide film via a low-pressure chemical vapor deposition (LPCVD) process. The nitride film is etched to form a nitride pattern 104 on the pad oxide film using a dry etching process and a photolithography process for forming active patterns.

The pad oxide film is etched using the nitride patterns 104 as etching masks such that pad oxide patterns 102 are formed on the semiconductor substrate 100 while portions of the semiconductor substrate 100 are exposed. The exposed portions of the semiconductor substrate 100 are etched to predetermined depths, thereby forming trenches 106 in the semiconductor substrate 100. An anti-reflection layer (not shown) may be formed on the nitride film in order to improve a processing margin of the photolithography process for forming the active patterns.

Figure 4B:
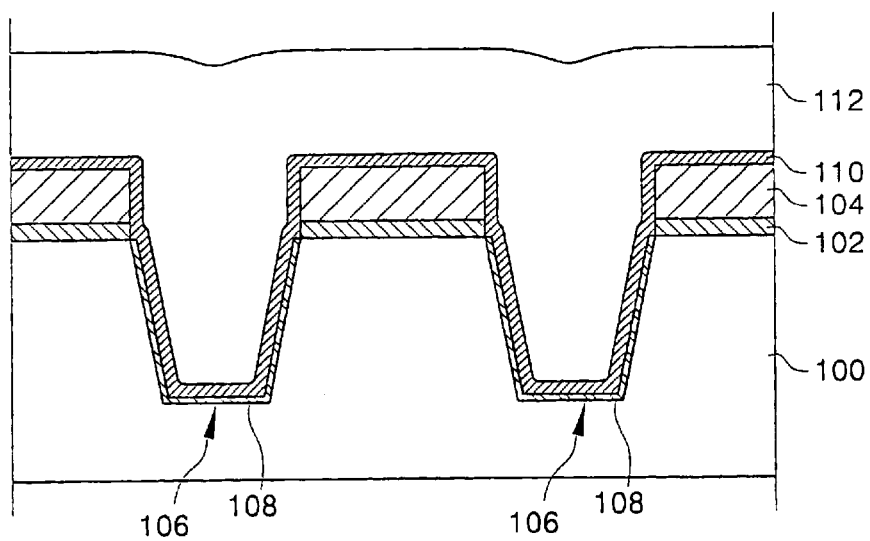

Referring to FIG. 4B, the exposed portions of the trenches 106 are thermally treated in an oxygen atmosphere to cure any damage to the silicon in the substrate 100 caused by high energy ion implantation. Thus, inner oxide films 108 are formed in the trenches 106 in accordance with the reaction between the silicon and an oxidizer. Liners 110 including nitride films are formed on the nitride patterns 104 and on the inner oxide films 108 in order to prevent or reduce an amount of oxygen ($O_2$) from permeating into the inner oxide films 108 during a subsequent oxidization process due to the fact that the inner sidewalls of the trenches 106 may be additionally oxidized when the oxygen permeates into the inner oxide films 108. The liners 110 are formed through the LPCVD process to have thickness of approximately 35 to 45 Å. Also, to prevent the liners 110 from being damaged during a subsequent process of forming an oxide film in the trenches 106, another oxide film (not shown) having thickness of approximately 100 Å may be formed on the liners 110 including nitride if needed as the occasion demands.

An oxide film having a good gap filling property is formed in the trenches 106 and on the substrate 100 using a chemical vapor deposition (CVD) to provide an oxide film 112. The trench filling oxide film 112 can include undoped silicate glass (USG), ozone-tetraethoxysilane USG ($O_3$-TEOS USG) or a high density plasma (HDP) oxide. Preferably, the trench filling oxide film 112 includes an HDP oxide film formed by generating the HDP using a $SiH_4$ gas, an $O_2$ gas and an Ar gas as sources of plasma gases.

Figure 4C:
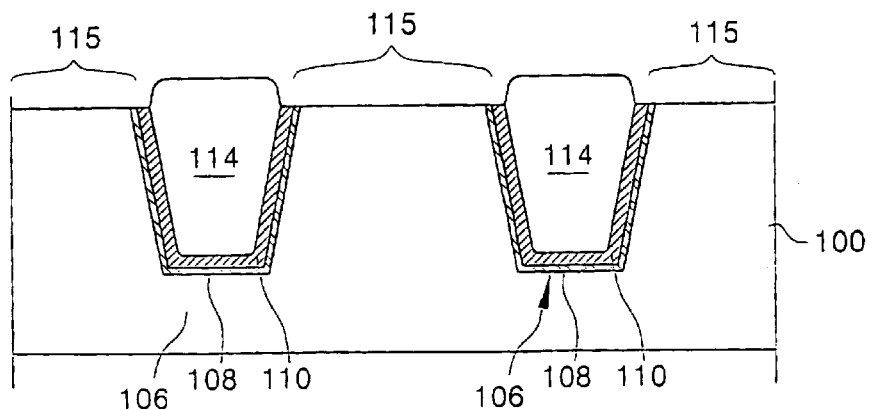

Referring to FIG. 4C, the trench filling oxide film 112 and upper portions of the nitride patterns 104 are removed by a chemical-mechanical polishing (CMP) process or an etch back process. As a result, STI regions 114 having the liners 110 on the inner sidewall of the trenches 106 are formed. Furthermore, active regions 115 are formed between the STI regions 114. The nitride patterns 104 are removed by a wet etching process using a nitride etchant such as phosphoric acid. The pad oxide patterns 102 can also be removed by the wet etching process using an oxide etchant such as hydrofluoric acid (HF).

Figure 4D:
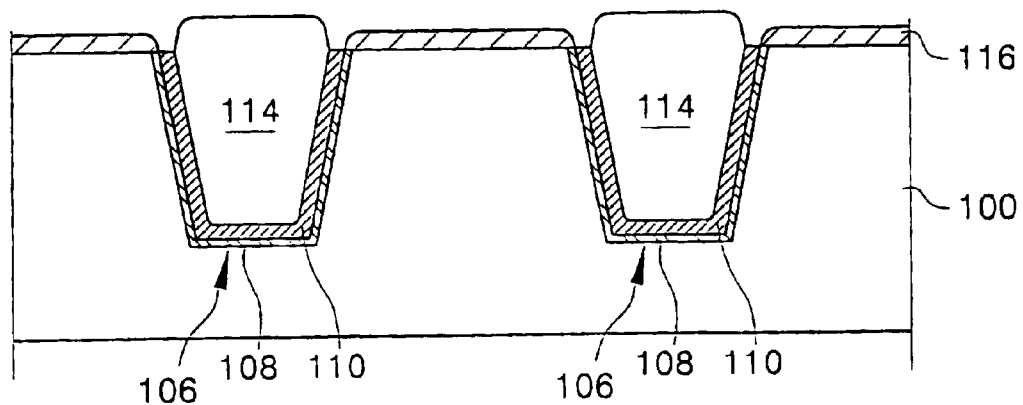

Referring to FIG. 4D, the semiconductor substrate 100 is rinsed using HF or a standard cleaning solution including $NH_4OH$, $H_2O_2$ and $H_2O$ by the ratio of approximately 1:4:20 (such as SC-1). A ate oxide film 116 is formed on the active regions 115 using an oxidization process, such as a dry oxidization or a wet oxidization process, in a first gas atmosphere having a reduced amount of chloride or, alternatively, substantially without any chloride. The gate oxide film 116 can be formed with a dry oxidization process using one of an $O_2$ gas, $O_2N_2$ gas, $O_2/N_2O$ gas and $O_2/NO$ gas at a temperature in a range between about 780° C. and about 850° C. In some embodiments according to the invention, the gate oxide film 116 is formed by a wet oxidization process using one of $H_2O_2$ gas or an $H_2O$ gas at the temperature in a range between about 780° C. to 850° C.

Figure 4E:
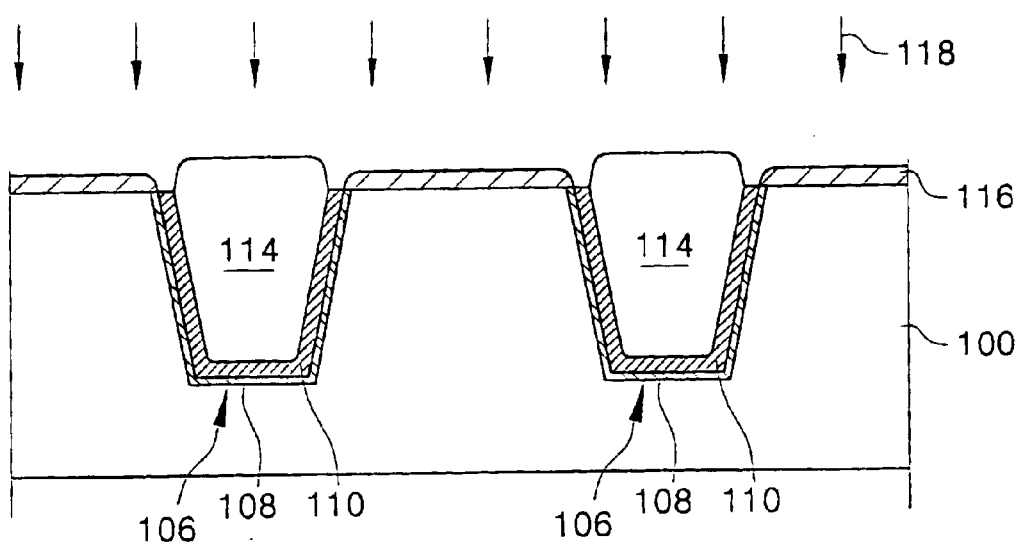

Referring to FIG. 4E, after the gate oxide film 116 is formed in the first gas atmosphere in which a reduced amount of chloride is included, the gate oxide film 116 is annealed in an atmosphere including a second gas 118 that includes an amount of chloride that is greater than the reduced amount of chloride in the first gas. Preferably, the second gas 118 includes one of HCl, $Cl_2$, $C_2HCl_3$, $CH_2Cl_2$, and $C_2H_3Cl_3$. In some embodiments according to the invention, the gate oxide film 116 is annealed at the temperature in a range between about 850° C. to 900° C. using a furnace or by a rapid thermal annealing (RTA) process. The oxidization and the annealing processes for the gate oxide film 116 are performed in-situ, although the oxidization and the annealing processes may be performed separately in different chambers.

The in-situ oxidization and annealing processes will now be described in greater detail. After the semiconductor substrate 100 is loaded in a chamber for the oxidization process, the chamber is heated to the temperature of approximately 850° C. The gate oxide film 116 is formed on the semiconductor substrate 100 using the oxidization process in the first gas atmosphere with a reduced amount of chloride (that is, a dry oxidization gas atmosphere of the $O_2$ gas, the $O_2/N_2$ gas, the $O_2/N_2O$ gas or the $O_2/NO$ gas, or a wet oxidization gas atmosphere of the $H_2/O_2$ gas or the $H_2O$ gas). The oxidization process described above can allow the formation of the gate oxide film 116 such that a thickness ratio of a first portion of the gate oxide film 116 located on a central portion of the active region 115 (i.e., spaced apart from an edge of the active region and the STI regions 114) and a section portion of the gate oxide film 116 located at the edge between the active region 115 and the STI regions 114, is in a range between about 1:1 and about 1:1.5. Because the gate oxide film 116 is formed using the oxidization process with a reduced amount of chloride, such as in the dry or wet oxidization processes described above, the gate oxide film 1 16 may have a more uniform thickness over the regions of the substrate on which it is formed and, specifically, may not be substantially thicker at the edge portion of the active region 115 than at other portions.

Subsequently, a nitrogen gas is introduced into the chamber to purge the gases remaining in the chamber while the chamber is heated to a temperature of about 900° C. When the chamber is purged, the gate oxide film 116 is annealed in the second gas 118 atmosphere including an amount of chloride that is greater than the reduced amount described above. In some embodiments according to the invention, the second gas 118 can be HCl, $Cl_2$, $C_2HCl_3$, $CH_2Cl_2$, and $C_2H_3Cl_3$. Thus, the surface defects and the silicon electrical potential of the gate oxide film 116 can be reduced because the chloride can be combined with the dangling bonds existing in the gate oxide film 116 or at the interface between the gate oxide film 116 and the silicon substrate 100. Also, the characteristics of the gate oxide film 116 may be improved since the heavy metal causing the leakage current may be removed from the gate oxide film 116. Furthermore, the gate oxide film 116 can have good time dependent dielectric breakdown (TDDB) and time zero dielectric breakdown (TZDB) characteristics in accordance the above-described process.

Figure 5A:
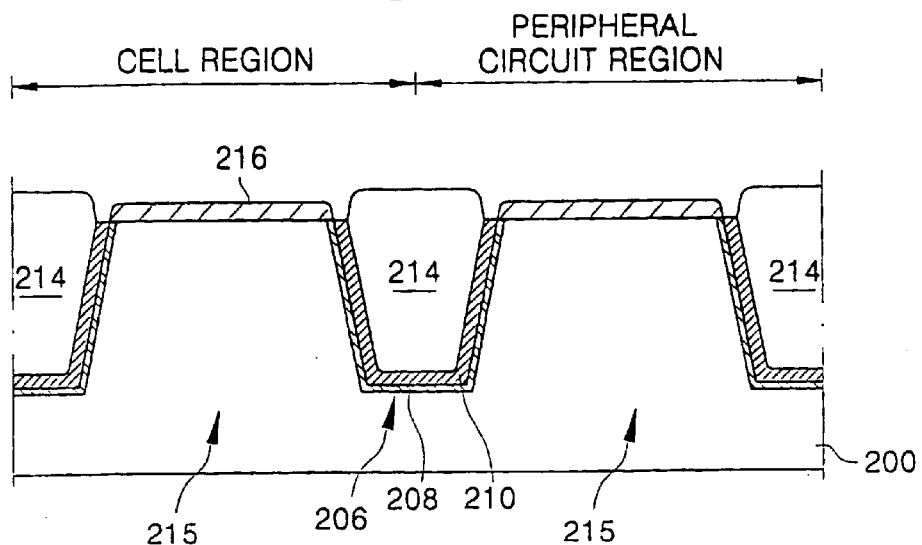
FIGS. 5A to 5D are cross-sectional views illustrating methods of forming a dual gate oxide film of an integrated circuit device according to embodiments of the present invention.

FIGS. 5A to 5D are cross-sectional views illustrating methods of forming a dual gate oxide film in a semiconductor device according to embodiments of the present invention. Referring to FIG. 5A. STI regions 214 are formed in a semiconductor substrate 200 including a cell region and a peripheral circuit region so that active regions 215 are defined in the semiconductor substrate 200. The STI regions 214 include trenches 206 and nitride liners 210 formed on the inner sidewall of the trenches 206. In some embodiments according to the invention, the STI regions 214, the trenches 206 and the nitride liners 210 are formed in the same manner as described above with reference to FIGS. 4A to 4C. In FIG. 5A, the reference designator 20S indicates an inner oxide film formed inside of the trench 206. In some embodiments according to the invention, the nitride liners 210 preferably have a thickness in a range between about 35 Å and about 45Å.

After the semiconductor substrate 200 is rinsed using a rinsing etchant, such as HF or SC-1, a first gate oxide film 216 having the thickness of about 73 Å is formed on the active regions 215 through an oxidization process under a first gas atmosphere with a reduced amount of chloride. For example, in some embodiments according to the invention, a dry oxidization process using one of an $O_2$ gas, $O_2/N_2$ gas, O₂/N₂O gas and O₂/NO gas at the temperature in a range between about 780° C. and about 900° C. In some embodiments according to the invention, a wet oxidization process is used to form the gate oxide film 216 using $H_2/O_2$ gas or an $H_2O$ gas at the temperature of approximately 780 to 900° C. The oxidization process used to form the first gate oxide film 216 may allow a ratio of a thickness of a first portion of the first gate oxide film 216 on a central portion of the active region 215 and a thickness of a second portion of the first gate oxide film 216 on an edge portion of the active region 215 to be in range between about 1:1 and about 1:1.5. The first gate oxide film 216 may not be substantially thicker at the edge portion of the active region 215 than on the central portion of the active region 215 because the first gate oxide film 216 is formed through the oxidization process using a reduced amount of chloride, such as in the dry or the wet oxidization processes described above.

After the first gate oxide film 216 is formed through the oxidization process in the first gas atmosphere with the use of the reduced amount of chloride, the first gate oxide film 216 is annealed in a second gas atmosphere that includes an amount of chloride that is greater than the reduced amount. In some embodiments according to the invention, the second gas is one of HCl, $Cl_2$, $C_2HCl_3$, $CH_2Cl_2$, and $C_2H_3Cl_3$, and the first gate oxide film 216 is annealed using a furnace or by the RTA process at a temperature in a range between about 850° C. and about 900° C. Additionally, the oxidization and the annealing processes from the first gate oxide film 216 are performed in-situ, although the oxidization and the annealing processes may be performed separately in different chambers. Surface defects and the silicon electrical potential of the first gate oxide film 216 can he reduced because the chloride can combine with the dangling bonds existing in the first gate oxide film 216 or at the interface between the first gate oxide film 216 and the silicon substrate 200. Also, the characteristics of the first gate oxide film 216 can be improved since the heavy metal causing the leakage current can be removed from the gate oxide film 216. Furthermore, the first gate oxide film 216 can have good TDDB and TZDB characteristics in accordance the above-described processes.

Figure 5B:
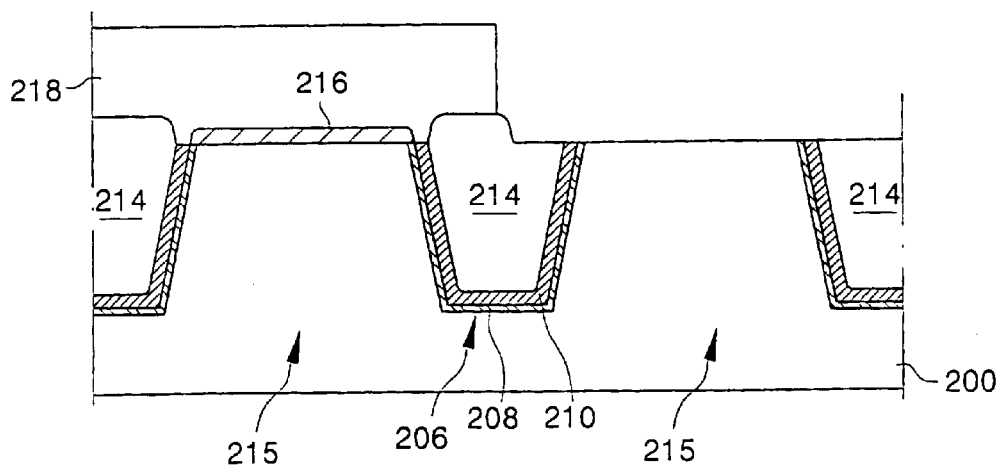

Referring to FIG. 5B, a photoresist film is formed on the surface of the semiconductor substrate 200 including the first gate oxide film 216. The photoresist film is developed to form a photoresist pattern 218 that exposes the peripheral circuit region where a thin gate oxide film is to be formed. The portion of the first gate oxide film 216 on the peripheral circuit region is removed by a wet etching process using the photoresist pattern 218 as an etching mask. The photoresist pattern 218 can be removed through an ashing and stripping processes.

Figure 5C:
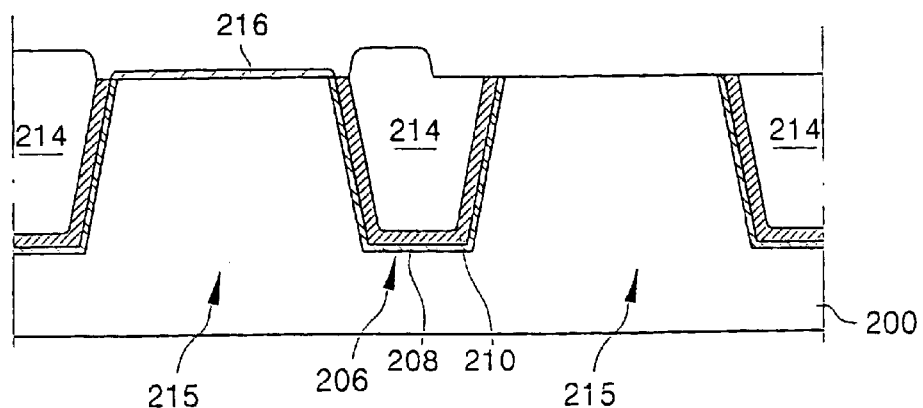

Referring to FIG. 5C, the substrate 200 is rinsed with a solution including HF and SC-lusing in a wet rinsing process. During the rinsing process, the first ate oxide film 216 on the cell region is etched to a predetermined thickness.

Figure 5D:
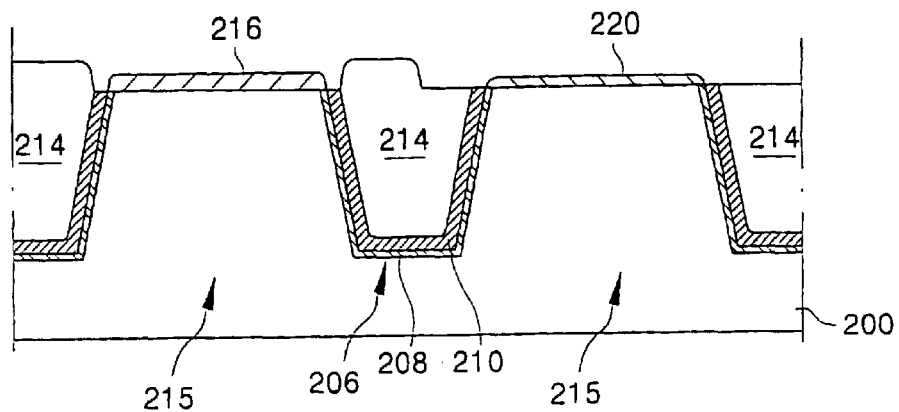

Referring to FIG. 5D, an oxidization process is performed on the resultant structure so that a second gate oxide film 220 is formed in the peripheral circuit portion. As shown in FIG. 5D, the second gate oxide film 220 can be thinner than the first gate oxide film 216. For example, in some embodiments according to the invention, the second gate oxide film 220 has a thickness of about 54 Å, and the oxidization process is a hydrochloric acid oxidization process using a gas of O₂/HCl. In this case, the first gate oxide film 216 in the cell region can become thicker than the gate oxide film 220 in the peripheral region to have the thickness of about 83 Å because the oxidization process is performed on the whole surface of the substrate 200. Therefore, the thick first gate oxide film 216 is formed in the cell region while the thin second gate oxide film 220 is formed in the peripheral circuit region. Having gate oxide films with different thicknesses can allow the threshold voltage of respective transistors to be different. For example, the threshold voltage of a transistor in the cell region can be adjusted by the increased thickness of the first gate oxide film 216 by allowing the channel ion implantation dose to be reduced and, thereby improving the static refresh.

In the present embodiment, the dual gate oxide film can be formed by forming the first gate oxide film 216 using a dry or wet oxidization process with a reduced amount of chloride whereas the annealing process uses an amount of chloride that is greater than the reduced amount. The second gate oxide film 220 can be formed using a hydrochloric acid oxidization process. In some embodiments according to the invention, an anneal of the second gate oxide film 220 can be performed in a gas atmosphere that includes the greater amount of chloride after the second gate oxide film is formed using a dry or the wet oxidization process with a reduced amount chloride.

Figure 6A:
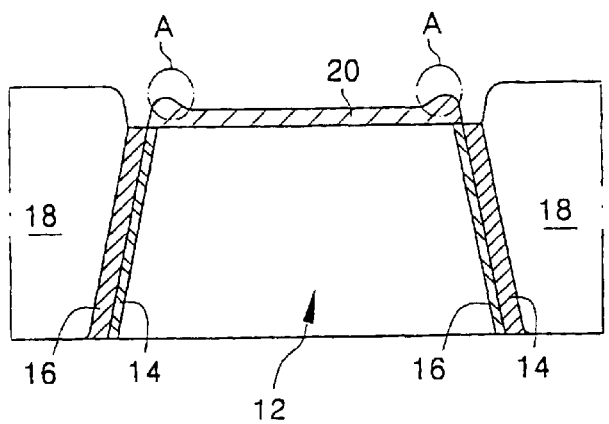
FIGS. 6A and 6B are cross-sectional views illustrating profiles of STI regions formed according to the conventional methods and according to embodiments of the present invention respectively.
Figure 6B:
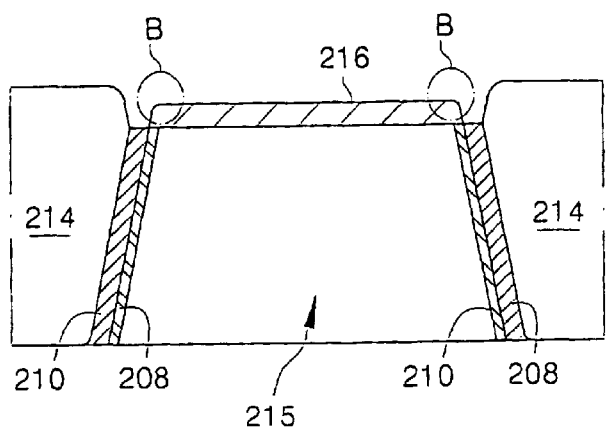

FIG. 6B is an enlarged cross-sectional view illustrating embodiments of STI regions formed according to the invention. A first gate oxide film 216 having a thickness of about 73 Å is formed on a semiconductor substrate where an active region 215 is defined by STI regions 214. The STI regions include an inner oxide film 208 and a nitride liner 210 formed on an inner sidewall of a trench. The first gate oxide film 216 is formed through an oxidization process with the reduced amount of chloride such as a dry oxidization process or a wet oxidization process. The first gale oxide film 216 is annealed under the gas atmosphere including an amount of chloride that is greater than the reduced amount. The semiconductor substrate is rinsed in a wet rinsing process after the first gate oxide film 216 is removed from the peripheral circuit region where a thin gate oxide film is to be formed through a photolithography process and a wet etching process.

A second gate oxide film (not shown) having a thickness of about 54 Å is formed in the peripheral circuit region with a hydrochloric acid oxidization process using a gas of O₂/HCl. The thickness of the first gate oxide film 216 in the cell region can be increased by the hydrochloric acid oxidization process to about 83Å.

In the present invention, when the first gate oxide film 216 is formed through the oxidization process with a reduced amount of chloride, the width of the effective channel cannot decrease because the thickness of the gate oxide film 216 cannot be increased at the edge portion B of the active region 215. The first oxide film 216 is additionally annealed under the gas atmosphere including an amount of chloride that is greater than the reduced amount so that chloride can combine more readily with the dangling bonds in the first gate oxide film 216 or at the interface between the first gate oxide film 216 and the substrate. Therefore, the surface defects of the first gate oxide film 216 and the silicon dislocation can be cured, and the quality of the first gate oxide film 216 can be improved because heavy metals causing the leakage current are removed from the first oxide film 216. Also, the first ate oxide film 216 can have improved TDDB and TZDB characteristics.

As it is described above, according to the present invention, a gate oxide film of a semiconductor device having STI structure can be formed using a dry oxidization process or a wet oxidization process with a reduced amount of chloride. The gate oxide film can be annealed in a gas atmosphere that includes an amount of chloride that is greater than the reduced amount. Therefore, an effective width of the transistor's channel can preserved as the thickness of the gate oxide film may not substantially increase at the edge portion of the active region. Also, the quality of the gate oxide film can be improved due to the annealing process for the gate oxide film using the greater amount of chloride.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed:

1. A method for forming a gate oxide film in an integrated circuit device comprising:

forming a gate oxide film on a substrate on an active region adjacent to a trench isolation region in a first gas atmosphere with a first amount of chloride; and annealing the gate oxide film in a second gas atmosphere including a second amount of chloride that is greater than the first amount of chloride.

2. The method according to claim 1 wherein the gate oxide film comprises a first gate oxide film and the active region comprises a first active region in a cell region of the integrated circuit device, the method further comprising the step of:

forming a second gate oxide film on a second active area of the substrate in a peripheral region of the integrated circuit device spaced apart from the first active area in a second gas atmosphere with the second amount of chloride.

3. The method according to claim 1 wherein the first amount of chloride comprises substantially no chloride.

4. The method according to claim 1 wherein the first gate oxide film comprises a first thickness, the method further comprising:

reducing the first thickness of the first gate oxide film;

performing an oxidization process on the substrate spaced apart from the first gate oxide film using a third gas including chloride to form a second gate oxide film to a second thickness and to thicken the first gate oxide film to a third thickness that is greater than the second thickness.

5. The method according to claim 1 wherein the first gas comprises at least one of $O_2$ gas, $O_2/N_2$ gas, $O_2/N_2O$ gas and $O_2/NO$ gas.

6. The method according to claim 5 wherein the step of forming a gate oxide film comprises forming the gate oxide film a temperature in a range between about 780° C. and about 900° C.

7. The method according to claim 1 wherein the first gas comprises at least one of $H_2/O_2$ gas or $H_2O$ gas.

8. The method according to claim 7 wherein the step of forming a gate oxide film comprises forming the gate oxide film at a temperature in a range between about 780° C. and about 850° C.

9. The method according to claim 1 wherein a ratio between a first thickness of portion of the gate oxide film located on a central portion of the active region and a second thickness of a portion of the gate oxide film located at an edge portion of the active region is in a range between about 1:1 and about 1:1.5.

10. The method according to claim 1 wherein the second gas includes at least one selected from the group consisting of HCl, $Cl_2$, $C_2HCl_3$, $CH_2Cl_2$, and $C_2H_3Cl_3$.

11. The method according to claim 1 wherein the step of annealing comprises annealing the first gate oxide film using a furnace or by performing a rapid thermal annealing process.

12. The method according to claim 1 wherein the gate oxide film is annealed at a temperature in a range between about 850° C. and about 900° C.

13. The method according to claim 1 wherein the step of forming and annealing are performed in-situ.

14. A method for forming a gate oxide film in a integrated circuit device comprising:

forming a first gate oxide film having a first thickness on a integrated circuit substrate where an active region is defined by a trench isolation region having a liner formed on an inner sidewall of a trench wherein the first gate oxide film is formed by an oxidization process in a first gas atmosphere without chloride;

annealing the first gate oxide film in a second gas atmosphere including chloride;

forming a pattern on the integrated circuit substrate wherein the pattern exposes a first region of the integrated circuit substrate where a thin gate oxide film is formed;

removing a portion of the first gate oxide film from the first region using the pattern as an etching mask;

removing the pattern; and forming a second gate oxide film having a second thickness that is less than the first thickness on the first gate oxide film and on the first region by an oxidization process using a third gas atmosphere.

15. The method according to claim 14 wherein the first gas includes at least one selected from the group consisting of $O_2$ gas, $O_2/N_2$ gas, $O_2/N_2O$ gas and $O_2/NO$ gas.

16. The method according to claim 15 wherein the first gate oxide film is formed at a temperature of approximately 780 to 900° C.

17. The method according to claim 14 wherein the first gas includes $H_2/O_2$ gas or $H_2O$ gas.

18. The method according to claim 17 wherein the first gate oxide film is formed at a temperature of approximately 780 to 850° C.

19. The method according to claim 14 wherein a thickness ratio between a portion of the first gate oxide film at a central portion of the active region and a portion of the first gate oxide film at an edge portion of the active region is approximately 1:1 to 1:1.5.

20. The method according to claim 14 wherein the second gas includes at least one selected from the group consisting of HCl, $Cl_2$, $C_2HCl_3$, $CH_2Cl_2$, and $C_2H_3Cl_3$.

21. The method according to claim 14 wherein the first gate oxide film is annealed using a furnace or by a rapid thermal annealing process.

22. The method according to claim 14 wherein the first gate oxide film is annealed at a temperature of approximately 850 to 900° C.

23. The method according to claim 14 wherein forming the gate oxide film and annealing the first gate oxide film are performed in-situ.

24. The method according to claim 14 wherein the second gate oxide film is formed in the third gas atmosphere without chloride.

25. The method according to claim 24 wherein the third gas includes at least one selected from the group consisting of $O_2$ gas, $O_2/N_2$ gas, $O_2/N_2O$ gas and $O_2/NO$ gas.

26. The according to claim 24 wherein the third gas includes $H_2/O_2$ gas or $H_2O$ gas.

27. The method according to claim 24 further comprising:
   annealing the second gate oxide film in a fourth gas atmosphere including chloride.

28. The method according to claim 27 wherein the fourth gas includes at least one selected from the group consisting of HCl, $Cl_2$, $C_2HCl_3$, $CH_2Cl_2$, and $C_2H_3Cl_3$.

29. The method according to claim 27 wherein forming the second gate oxide film and annealing the second gate oxide film are performed in-situ.

* * * * *